United States Patent
Cavanna et al.

(10) Patent No.: US 7,613,980 B2
(45) Date of Patent: Nov. 3, 2009

(54) SYSTEM FOR COMPUTING A CRC VALUE BY PROCESSING A DATA MESSAGE A WORD AT A TIME

(75) Inventors: Vicent V. Cavanna, Loomis, CA (US); Patricia A. Thaler, Carmichael, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1477 days.

(21) Appl. No.: 10/456,210

(22) Filed: Jun. 6, 2003

(65) Prior Publication Data

US 2004/0250193 A1 Dec. 9, 2004

(51) Int. Cl.
*H03M 13/00* (2006.01)

(52) U.S. Cl. .................. 714/759; 714/757; 714/772

(58) Field of Classification Search .............. 714/759, 714/757, 772
See application file for complete search history.

(56) References Cited

U.S. PATENT DOCUMENTS

| | | | | |
|---|---|---|---|---|
| 5,325,372 A | * | 6/1994 | Ish-Shalom ............... | 714/757 |
| 5,619,516 A | * | 4/1997 | Li et al. .................... | 714/807 |
| 5,878,057 A | * | 3/1999 | Maa .......................... | 714/757 |
| 6,029,186 A | * | 2/2000 | DesJardins et al. ......... | 708/492 |
| 6,195,780 B1 | * | 2/2001 | Dravida et al. ............. | 714/758 |
| 6,766,490 B1 | * | 7/2004 | Garrabrant et al. ......... | 714/759 |
| 6,934,730 B2 | * | 8/2005 | Direen et al. .............. | 708/250 |
| 2002/0069232 A1 | * | 6/2002 | Direen et al. .............. | 708/400 |

OTHER PUBLICATIONS

Ross Williams, "A Painless Guide to CRC Error Detection Algorithms," Internet Publication, Aug. 1993, available at ftp://ftp.rocksoft.com/papers/crc_v3.txt. (35 pgs.).
R. Stewart et al. "Stream Control Transmission Protocol", Internet Engineering Task Force (IETF) Publication, Oct. 2000, available at www.ietf.org. (126 pgs.).
J. Stone et al., "Stream Control Transmisson Protocol (SCTP) Checksum Change", Internet Engineering Task Force (IETF) Publication, Sep. 2002, available at www.ietf.org. (16 pgs.).
D. Sheinwald et al., "Internet Protocol Small Computer System Interface (iSCSI) Cyclic Redundancy Check (CRC)/Checksum Considerations", Internet Engineering Task Force (IETF) Publication available at www.ietf.org. (22 pgs.).

* cited by examiner

*Primary Examiner*—Joseph D Torres

(57) ABSTRACT

A system for computing a CRC value includes at least one memory for storing a data message, a current CRC value, and a plurality of lookup tables. The data message includes a plurality of words, with each word including a plurality of bytes. Each of the lookup tables stores a plurality of multi-byte CRC values. The system includes a processor for processing the message a word at a time. The processor is configured to update the current CRC value during processing each word based on an XOR of the word and the current CRC value, and based on a multi-byte CRC value retrieved from each one of the lookup tables.

4 Claims, 4 Drawing Sheets

Fig. 2A

$$[c_0\ c_1\ c_2\ \cdots\ c_{31}] = [T_1\ |\ T_2\ |\ T_3\ |\ T_4] \begin{bmatrix} c_0 + d_0 \\ c_1 + d_1 \\ c_2 + d_2 \\ \vdots \\ c_{31} + d_{31} \end{bmatrix}$$

$$[c_0\ c_1\ c_2\ \cdots\ c_{31}] = [T_1] \begin{bmatrix} c_0 + d_0 \\ c_1 + d_1 \\ c_2 + d_2 \\ \vdots \\ c_7 + d_7 \end{bmatrix} + [T_2] \begin{bmatrix} c_8 + d_8 \\ c_9 + d_9 \\ c_{10} + d_{10} \\ \vdots \\ c_{15} + d_{15} \end{bmatrix} + [T_3] \begin{bmatrix} c_{16} + d_{16} \\ c_{17} + d_{17} \\ c_{18} + d_{18} \\ \vdots \\ c_{23} + d_{23} \end{bmatrix} + [T_4] \begin{bmatrix} c_{24} + d_{24} \\ c_{25} + d_{25} \\ c_{26} + d_{26} \\ \vdots \\ c_{31} + d_{31} \end{bmatrix}$$

202, 204A, 206A, 204B, 206B, 204C, 206C, 204D, 206D

SYSTEM FOR COMPUTING A CRC VALUE BY PROCESSING A DATA MESSAGE A WORD AT A TIME

THE FIELD OF THE INVENTION

The present invention generally relates to systems for computing CRC values, and more particularly to a system for computing a CRC value by processing a data message a word at a time.

BACKGROUND OF THE INVENTION

A purpose of error detection techniques, such as techniques based on cyclic redundancy codes (CRC's), is to enable the receiver of a message transmitted through a noisy channel to determine whether the message has been corrupted. To do this, the transmitter generates a value (called a Frame Check Sequence or FCS) that is a function of the message, and typically appends the FCS to the message. The receiver can then use the same function used to generate the FCS of the received message to see if the message was correctly received.

With CRC algorithms, message bits are treated as binary coefficients of an n-bit polynomial. The message polynomial is multiplied by $x^m$, where m is the CRC polynomial (i.e., "generator polynomial") order. The result of the multiplication is divided by the CRC polynomial. Most implementations use a method that simultaneously executes the multiplication by $x^m$ and the division by the CRC polynomial, rather than doing these operations in sequential order. The result of these operations is the FCS, which is typically complimented and appended to the message. In some cases, the FCS is not complimented, and occasionally the FCS is put in another location, such as in a header field.

The receiver divides the received message with the appended FCS by the CRC polynomial. Assuming that the FCS was complimented before being appended to the message, and that no errors occurred during transmission, the result of the division at the receiver will be a fixed value equal to the result of dividing the order $2^m$ polynomial (with coefficients of 1 for the upper m terms, and coefficients of 0 for the lower m terms) by the CRC polynomial. This fixed value is sometimes called the "magic number." If the result of the division is not equal to the magic number, this indicates that an error occurred.

Most software-based CRC algorithms process one byte of data at a time. A reason for processing one byte at a time appears to be the belief that large tables are needed for handling more bytes at a time, and also that a byte at a time circuit is typically used anyway in order to handle misaligned bytes, so the same circuit may be used to process all bytes. If the traditional method is extended to process sixteen bits at a time, a lookup table of $2^{16}$ entries might be used, consuming 256 kilobytes for a 32-bit CRC. If the traditional method is extended to process thirty-two bits at a time, the lookup table would consume sixteen gigabytes for a 32-bit CRC.

A problem with software CRC computations using traditional methods is that multiple instructions are executed per data byte, which makes the software CRC computation very burdensome. Many processors operate more efficiently when they can do word-wide computations.

SUMMARY OF THE INVENTION

One form of the present invention provides a system for computing a CRC value. The system includes at least one memory for storing a data message, a current CRC value, and a plurality of lookup tables. The data message includes a plurality of words, with each word including a plurality of bytes. Each of the lookup tables stores a plurality of multi-byte CRC values. The system includes a processor for processing the message a word at a time. The processor is configured to update the current CRC value during processing of each word based on an XOR of the word and the current CRC value, and based on a multi-byte CRC value retrieved from each one of the lookup tables.

BRIEF DESCRIPTION OF THE DRAWINGS

FIG. 2A is a diagram illustrating elements of the matrix and vectors in one form of the next state equation.

FIG. 2B is a diagram illustrating elements of the matrix and vectors in one form of the next state equation, with the matrix shown in FIG. 2A divided into four separate matrices.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

As will be understood by persons of ordinary skill in the art, CRC calculations are performed using binary arithmetic modulo-2 (MOD-2) with no carry. With such arithmetic, both addition and subtraction are equivalent to the logical exclusive-OR (XOR) operation, and multiplication is equivalent to a logical AND operation. Thus, the symbols "+" and "−" indicate a logical XOR, and the symbol "*" indicates a logical AND.

Figure 1:
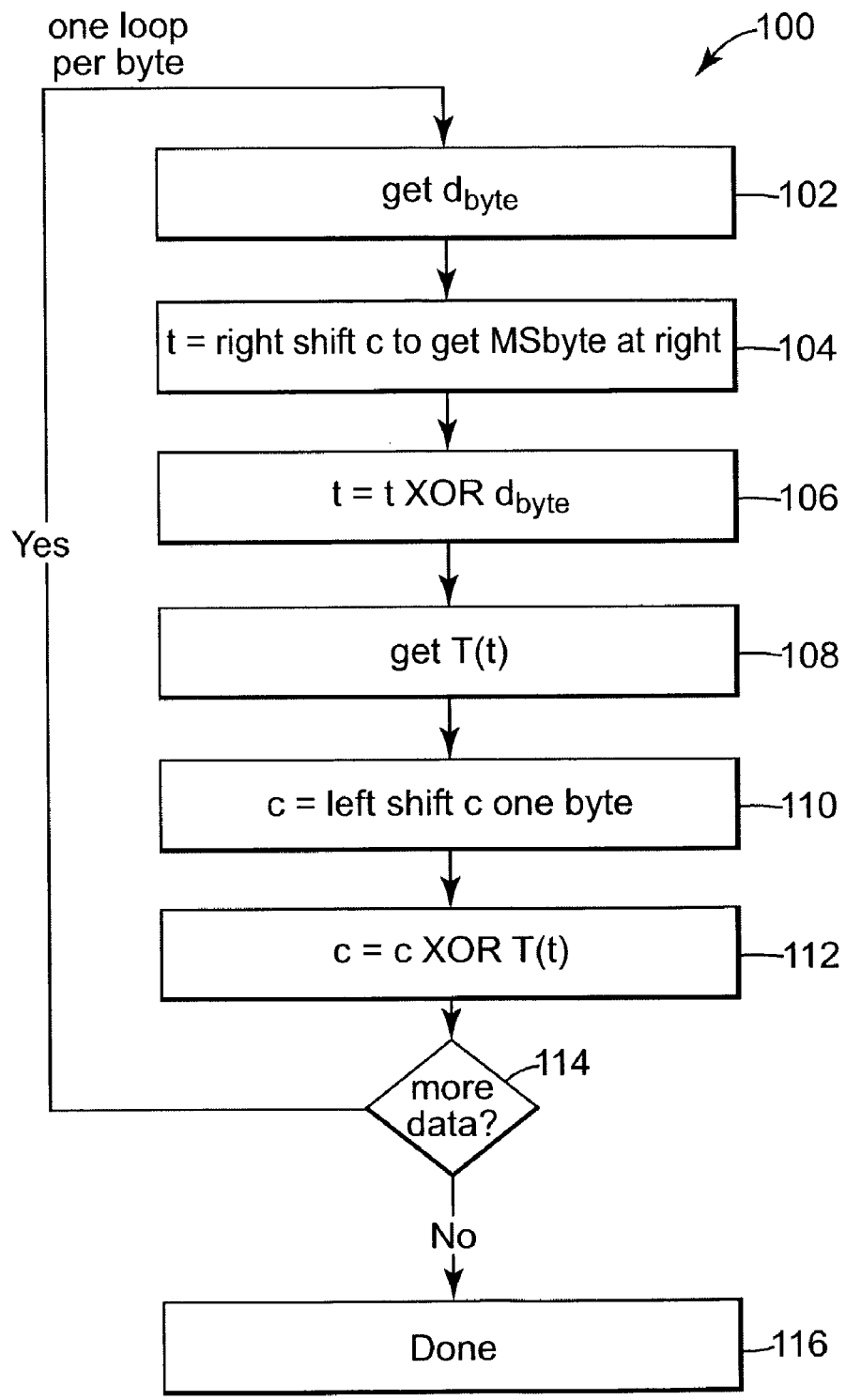
FIG. 1 is a flow diagram illustrating a prior art method for calculating CRC's by processing a data message a byte at a time.

As mentioned above in the Background of the Invention section, most software-based CRC algorithms process one byte of data at a time. A CRC remainder register is typically used to store the current CRC remainder. FIG. 1 is a flow diagram illustrating a prior art method 100 for calculating CRC's by processing a data message a byte at a time. For the method 100 illustrated in FIG. 1, it is assumed that an order-32 CRC polynomial is being used, and therefore, the CRC remainder is thirty-two bits. In step 102, the next data byte, $d_{byte}$, from a data message is retrieved. In step 104, the CRC remainder register, c, is shifted right to get the most significant byte from the register, which is stored as a temporary result, t. In step 106, an XOR operation is performed on the temporary result, t, from step 104, and the data byte, $d_{byte}$, retrieved in step 102. The result of the XOR operation is stored as a temporary result, t. In step 108, a value is retrieved from a lookup table, T, at a position corresponding to the temporary result, t, obtained in step 106. Thus, the result of the XOR operation in step 106 serves as an index into the lookup table, T. Traditional byte-at-a-time CRC algorithms, such as shown in FIG. 1, use a single lookup table of 256 entries. Each entry in the lookup table is the width of the CRC, which is typically thirty-two bits.

In step 110, the CRC remainder register, c, is shifted left by one byte, and the result is stored in the CRC remainder register, c. In step 112, an XOR operation is performed on the CRC remainder register, c, and the value, T(t), which was obtained from the lookup table in step 108. The result of the XOR operation in step 112 is stored in the CRC remainder register, c. In step 114, it is determined whether there is any more data to be processed. If there is more data, the method 100 returns to step 102 to process the next byte of data in the message. If there is no more data to be processed, the method 100 is done, as indicated by step 116.

The following Code Example I provides an example of code in the C programming language that may be used to implement method 100 shown in FIG. 1. The code in Code Example I is traditionally used for byte-at-a-time CRC calculations for a 32-bit wide CRC.

$$\text{while } (\text{len}--)c=(c<<8)\hat{~}t[(c>>24)\hat{~}*p++]; \quad \text{Code Example I}$$

where:
  len=length of the data message;
  c=32-bit CRC remainder register;
  t=lookup table; and
  p=pointer or index for identifying the location of the next data byte to be processed.

The above Code Example I is a non-reflecting algorithm from Williams, Ross, "A PAINLESS GUIDE TO CRC ERROR DETECTION ALGORITHMS," Internet Publication, August 1993, available at ftp://ftp.rocksoft.com/papers/crc_v3.txt.

Beginning on the right side of the equation in Code Example I, the code "*p" retrieves the contents of the address that is being pointed to by the pointer p, which is the address holding the next byte from the data message. After retrieving the next data byte, the index p is incremented, as indicated by the code "++", to point to the address of the data byte to be processed in the next iteration. The code "c>>24" indicates that the CRC remainder register is shifted right twenty-four bits (three bytes). An XOR operation (^) is performed on the right-shifted CRC remainder register and the current data byte. The result of the XOR operation is an index into the lookup table, t, so the code "t[(c>>24)^*p++]" causes a value to be retrieved from the lookup table at a location identified by the result of the XOR operation.

The code "c<<8" indicates that the CRC remainder register is shifted left eight bits (one byte). An XOR operation (A) is performed on the left-shifted CRC remainder register and the value obtained from the lookup table, with the result of the XOR operation being stored in the CRC remainder register. The code "while (len--)" indicates that the length of the data message (len) is decremented (--) after each iteration, so the above process is repeated for each byte of the message until the entire message has been processed.

The equation in Code Example 1 is used for each byte of the data message to compute the CRC. The code in Code Example I requires execution of many instructions per each byte processed. For each byte, there are two shift instructions, a read of a data byte, an XOR of that data byte with the result of one of the shift operations, a read of a table value, and an XOR of the value from the table with the result of the second shift.

The equation in Code Example I is referred to as the "next state equation," because it shows the next state of the CRC as a function of the present state of the CRC and of the input. The following Equation I shows the next state equation in matrix form:

$$c=Ac+Bd \quad \text{Equation I}$$

where:
  c=CRC remainder register (vector);
  d=next set of data to be processed (vector);
  A=constant matrix with values that depend on the CRC generator polynomial being used; and
  B=constant matrix with values that depend on the CRC generator polynomial being used.

The size of vector d is equal to the number of data bits processed in one cycle. The number of columns in matrix B is equal to the size of vector d.

As indicated by Equation I, the constant matrix A is multiplied by the CRC remainder vector, c, and the constant matrix B is multiplied by the data vector, d. Each of these two matrix multiplications results in a new vector. An XOR of the two new vectors is performed, and the result of the XOR is stored in the CRC remainder register, c.

The calculations in Equation I are based on MOD-2 math. The elements in the matrices (i.e., matrices A and B) and in the vectors (i.e., vectors c and d) are either 0 or 1. Processors do not provide instructions for MOD-2 matrix multiplication, and bit manipulation operations typically require many instructions. To do these operations efficiently, lookup tables are typically used. The multiplications in Equation I involve multiplying a constant matrix by a variable vector. The result is a vector with the same width as the lookup table. Since the matrices A and B are constant matrices, a table containing the result vector for each possible input vector can be pre-calculated.

The next state equation given in Equation I above can be manipulated into various forms depending upon the number of data bits processed per cycle and the width of the CRC used. Four cases are described below. In the first case (Case 1), the number of data bits processed per cycle is less than the number of CRC bits. In the second case (Case 2), the number of data bits processed per cycle is less than the number of CRC bits, and input and output "reflections" are applied. Reflection is described in further detail below with reference to Case 2. In the third case (Case 3), the number of data bits processed per cycle is equal to the number of CRC bits. In the fourth case (Case 4), the number of data bits processed per cycle is more than the number of CRC bits. Note that when polynomial coefficients are shown as a vector for non-reflected cases, the coefficient of the lowest order term is at the top of the vector, and the coefficient of the highest order term is at the bottom of the vector.

Case 1

In Case 1, the number of data bits processed per cycle is less than the number of CRC bits. For this case, the next state equation given in Equation I above can be transformed into the following Equation II:

$$c=Ac+B'd' \quad \text{Equation II}$$

where:
  c=CRC remainder register (vector);
  d'=d from Equation I augmented with zeros on top of the vector to have the same size as c;
  A=constant matrix with values that depend on the CRC generator polynomial being used; and
  B'=matrix B from Equation I augmented with zeros on the left side of the matrix to have the same size as A.

Note that by augmenting vector d and matrix B as described above, the non-zero data of vector d' is aligned to the most significant byte of vector c. The purpose of this alignment is to match the form for the non-reflecting algorithm proposed in the above-cited Ross Williams publication. In Equation II, matrices A and B' are complicated matrices. It is possible to convert Equation II into a simpler form, where one of the matrices becomes a simple shifting matrix, and the second matrix is implemented with a set of equations or a table. Such a form is what is proposed in the Ross Williams publication cited above. A shifting matrix is a matrix with a diagonal line of "1's" and the other values in the matrix are "0's". The shifting matrix shifts the bit positions of a vector. The following description shows how to convert Equation II into the form proposed in the Ross Williams publication.

Introducing the terms +B'c and −B'c on the right hand side of Equation II, and then factoring, results in the following Equation III:

$$c = A'c + B'(c+d') \qquad \text{Equation III}$$

where:

$A' = A - B'$

In Equation III, matrix A' is a left shifting (by one byte) matrix. The second term, B' (c+d'), can be implemented with lookup tables. For the case of a 32-bit CRC, and processing one byte of data per cycle, the results using the above Equation III agree with the algorithm (i.e., Code Example I above) from the Ross Williams publication for the case of no input or output reflection. Code Example I in matrix form is the same as Equation III, since matrix A' in Equation III shifts left by one byte, and since vector d' in Equation III is aligned to the most significant byte of vector c by virtue of how vector d' is created from vector d.

In one embodiment of the present invention, an algorithm based on Equation III is used to handle partial words (e.g., one, two, or three bytes) at the beginning and/or end of a data message. In one form of the invention, an algorithm based on Equation III is also used to handle data words for the case where the processor word width is smaller than the CRC width (e.g., a 16-bit word machine calculating a 32-bit CRC, or a 32-bit word machine calculating a 64-bit CRC). In one embodiment, the second term, B' (c+d') is implemented with four lookup tables.

Case 2

Sometimes the order of bit significance for the purpose of CRC computation is not the same as the native bit order of the machine performing the computation. "Reflection" refers to modification of the CRC computation so that the CRC can be computed with the correct bit significance regardless of the native bit order of the machine. A value is reflected if its bits are swapped around its center. For example, 0101 is the 4-bit reflection of 1010, and 0011 is the 4-bit reflection of 1100.

In Case 2, the number of data bits processed per cycle is less than the number of CRC bits, and it is desired that the input be reflected (because it was not stored in the desired order in the machine), that the final CRC is to be reflected (output reflection), and that a "byte swap" operation is to be performed. In some cases, the order of the bytes coming out of a CRC remainder register is different than the order that the bytes will be appended to the message. In such cases, a "byte swap" operation is performed to appropriately re-order the bytes before they are appended to the message. The specifications for the Internet Protocol Small Computer System Interface (iSCSI) and Stream Control Transmission Protocol (SCTP) include CRC algorithms that reflect the input (because data is stored in memory in an order that is different than what the SCTP CRC algorithm specifies), generate a reflected output, and perform a byte swap operation. Information regarding the CRC algorithms for iSCSI and SCTP is available on the Internet Engineering Task Force (IETF) website at http://www.ietf.org (see, e.g., Request For Comments (RFC) documents 2960, 3309, and 3385).

To efficiently perform CRC calculations when the input must be reflected, the interim CRC result is kept in a bit order that matches the input bit order and tables are adjusted to compensate for the reflected bit ordering. Thus, the processor does not have to reorder the bits—a process that would take multiple cycles. The following explains the operation of one embodiment of a method that allows the bits to be processed in machine order.

For Case 2, the next state equation given in Equation I above can be transformed into the following Equation IV:

$$c = Ac + B'd' \qquad \text{Equation IV}$$

where:

c = CRC remainder register (vector);

d' = d from Equation I augmented with zeros on the bottom of the vector;

A = constant matrix with values that depend on the CRC generator polynomial being used; and B' = matrix B from Equation I augmented with zeros on the right side of the matrix.

Note that by augmenting vector d and matrix B as described above, the non-zero data of vector d' will be aligned to the most significant coefficients of the reflected c vector below. This alignment is different from Case 1. The purpose of this alignment is to match the form for the reflecting algorithm proposed in the above-cited Ross Williams publication. The code for the non-reflecting algorithm proposed in the Ross Williams publication is shown in the following Code Example II:

```
while (len--)reflc=(reflc>>8)^t[reflc^*p++]     Code Example II
```

Since Case 2 involves input reflection, the vector d' in Equation IV should be replaced by "refld'" as shown in the following Equation V:

$$c = Ac + B'\text{refld}' \qquad \text{Equation V}$$

where:

refld' = R8 d'; and

R8 = a matrix that performs 8-bit reflection.

The iSCSI CRC algorithm expressed in matrix form is given by the following Equation VI:

$$\text{reflc} = A'\text{reflc} + B1'(\text{reflc}+d') \qquad \text{Equation VI}$$

where:

reflc = R32 c; and

R32 = a matrix that performs a 32-bit reflection that is equivalent to byte reflection and byte swap.

The matrix A' in Equation VI is a matrix that shifts right by eight positions. Using Equation V, it can be shown that the matrix A' in Equation VI is defined by the following Equation VII:

$$A' = R32A \text{ inverse}R32 - R32B'R8 \qquad \text{Equation VII}$$

where:

inverseR32 = a matrix that is the matrix inverse of R32.

The term B1' in Equation VI can be implemented with a table. Using Equation V, it can be shown that the term B1' in Equation VI is defined by the following Equation VIII:

$$B1' = R32B'R8 \qquad \text{Equation VIII}$$

In one embodiment of the present invention, an algorithm based on Equation VI is used to handle partial words at the beginning and end of a data message when input reflection, output reflection, and byte swap operations are desired.

Case 3

In Case 3, the number of data bits processed per cycle is equal to the number of CRC bits. In one embodiment, Case 3 is used to handle full words of data if the data word is the same length as the CRC, such as when computing a 32-bit CRC on a processor with a 32-bit word size. For Case 3, due to the nature of the CRC calculation, matrix A equals matrix B in the next state equation (Equation I). Thus, Equation I can be written in the form given by the following Equation IX:

$$c=A(c+d) \qquad \text{Equation IX}$$

where:
- c=CRC remainder register (vector);
- d=next set of data to be processed (vector); and
- A=constant matrix with values that depend on the CRC generator polynomial being used.

The right side of Equation IX can be implemented with a lookup table, as illustrated in the following Code Example III:

$$c=t[c+d] \qquad \text{Code Example III}$$

As shown in Code Example III, an XOR operation is performed on the vectors c and d, and the result of the XOR is an index into the lookup table, t. The value retrieved from the lookup table is stored in the CRC remainder register, c. The lookup table for Code Example III would have $2^n$ entries, where n is the size of the CRC. In one form of the present invention, as described in further detail below, rather than performing a lookup in one large lookup table, the operation is broken into four lookups in four small lookup tables, with one lookup for each byte of c+d. In one embodiment, each of the four tables has 256 entries.

If input reflection is desired, Equation IX is changed to the following Equation X:

$$c=A(c+\text{refld}) \qquad \text{Equation X}$$

where:
- refld=R8' d; and
- R8'=a 32×32 matrix that performs bit reversal of the bits within each byte of the 32-bit vector d independently (i.e., no byte swap)

If both input and output reflections are desired, with no byte swap, Equation IX is changed to the following Equation XI:

$$\text{reflc}=A'(\text{reflc}+d) \qquad \text{Equation XI}$$

where:
- reflc=R8' c;
- R8'=a 32×32 matrix that performs bit reversal of the bits within each byte of the 32-bit vector d independently (i.e., no byte swap); and
- A'=R8'AR8'

Case 4

In Case 4, the number of data bits processed per cycle is more than the number of CRC bits. In one embodiment, Case 4 is used to handle full words of data, if the data word is wider than the CRC, such as with a 16-bit CRC computation on a 32-bit processor. Assuming that the number of CRC bits is n and the number of data bits is m, the dimensions of the matrices in Equation I are: c is n×1; A is n×n; B is n×m; and d is m×1. The next state equation (Equation I) can be written as shown in the following Equation XII:

$$c=Ac+B0d0+B1d1 \qquad \text{Equation XII}$$

where:
- B0=the left part of matrix B (n columns of B);
- B1=the right part of matrix B (m-n columns of B);
- d0=the upper part (n bits) of vector d; and
- d1=the lower part (m-n bits) of vector d.

Introducing the terms +B1c and −B1c on the right hand side of Equation XII, and then factoring, results in the following Equation XIII:

$$c=(A+B1)c+B1(d1-c)+B0d0 \qquad \text{Equation XIII}$$

The matrices A and B1 are identical, so the term (A+B1) in Equation XIII is zero. Thus, Equation XIII can be simplified into the following Equation XIV:

$$c=B1(d1-c)+B0d0 \qquad \text{Equation XIV}$$

The two terms B1 (d1-c) and B0 d0 can each be implemented with a large lookup table of $2^{16}$ entries. In one embodiment, as described in further detail below, the terms B1 (d1−c) and B0d0 are each implemented with two tables of $2^8$ entries.

Implementation

Using the example of a 32-bit CRC in Case 3, a single lookup table would have 232 entries of four bytes each, which is too large to store in processor cache, and is burdensome for regular memory. As mentioned above in Case 3 and Case 4, in one form of the invention, rather than using one large lookup table, the table is broken up into the sum of four smaller tables. Case 3 will be addressed first, followed by Case 4.

For Case 3, replacing the matrix A with the matrix T in Equation IX above, results in the following Equation XV:

$$c=T(c+d) \qquad \text{Equation XV}$$

where:
- c=CRC remainder register (vector);
- d=next set of data to be processed (vector); and
- T=constant matrix with the same values as matrix A (and matrix B, since A=B in case 3).

FIG. 2A is a diagram illustrating elements of the matrix and vectors in Equation XV. As shown in FIG. 2A, the result vector (c) 202 is equal to the constant matrix (T) 204 multiplied by the variable vector (c+d) 206. The result vector 202 is a one by thirty-two vector that includes thirty-two elements $c_i$, where i ranges from zero to thirty-one. The constant matrix 204 is a thirty-two by thirty-two matrix that includes 1024 elements $t_{i0}$ through $t_{i31}$, where i ranges from zero to thirty-one. The variable vector 206 is a one by thirty-two vector that includes thirty-two elements, (c0+d0), (c1+d1), (c2+d2), . . . (c31+d31). Recall that the symbol "+" represents an XOR operation. Each element $c_i$ of the result vector 202 is given by the following Equation XVI:

$$c_i=t_{i0}*(c_0+d_0)+t_{i1}*(c_1+d_1)+t_{i2}*(c_2+d_2)+\ldots+t_{i30}*(c_{30}+d_{30})+t_{i31}*(c_{31}+d_{31}) \qquad \text{Equation XVI}$$

As shown in FIG. 2A, the constant matrix 204 can be divided into four matrix portions T1-T4. Each one of the four matrix portions T1-T4 includes eight columns and thirty-two rows (i.e., 256 elements). FIG. 2B is a diagram illustrating elements of the matrix and vectors in Equation XV, with the matrix portions T1-T4 shown as separate eight by thirty-two constant matrices 204A-204D, respectively. As shown in FIG. 2B, the variable vector 206 (FIG. 2A) has been divided into four 8-bit variable vectors 206A-206D. Thus, instead of doing one matrix multiplication as shown in FIG. 2A, four matrix multiplications are performed, as shown in FIG. 2B. Each of the four matrix multiplications is a constant matrix multiplied by an 8-bit variable vector, resulting in four 32-bit result vectors. The four 32-bit result vectors are then added.

The four 32-bit result vectors are identified as Ca, Cb, Cc, and Cd. Each of the result vectors Ca, Cb, Cc, and Cd, includes thirty-two elements $Ca_i$, $Cb_i$, $Cc_i$, and $Cd_i$, respectively, where i ranges from zero to thirty-one. The elements for result vector Ca are given by the following Equation XVII:

$$Ca_i = t_{i0}*(c_0+d_0)+t_{i1}*(c_1+d_1)+\ldots t_{i7}*(c_7+d_7) \quad \text{Equation XVII}$$

The elements for result vector Cb are given by the following Equation XVIII:

$$Cb_i = t_{i8}*(c_8+d_8)+t_{i9}*(c_9+d_9)+\ldots t_{i15}*(c_{15}+d_{15}) \quad \text{Equation XVIII}$$

The elements for result vector Cc are given by the following Equation XIX:

$$Cc_i = t_{i16}*(c_{16}+d_{16})+t_{i17}*(c_{17}+d_{17})+\ldots t_{i23}*(c_{23}+d_{23}) \quad \text{Equation XIX}$$

The elements for result vector Cd are given by the following Equation XX:

$$Cd_i = t_{i24}*(c_{24}+d_{24})+t_{i25}*(c_{25}+d_{25})+\ldots t_{i31}*(c_{31}+d_{31}) \quad \text{Equation XX}$$

The result of $Ca_i+Cb_i+Cc_i+Cd_i$ (i.e., adding the results from Equations XVII, XVIII, XIX, and XX) is equal to $C_i$ (i.e., the result of Equation XVI). Thus, the sum of the four matrix multiplications shown in FIG. 2B is the same as the result of the original calculation using a single constant matrix 204 as shown in FIG. 2A.

Since each of the four matrix multiplications is a constant matrix times an 8-bit variable vector, a pre-calculated lookup table may be used for each of the four multiplications. Each lookup table has $2^8$ entries (256 entries), with entry being four bytes wide. The four lookup tables, therefore, consume a total of four kilobytes of storage. In contrast, if a single lookup table were used, the table would have $2^{32}$ entries of four bytes each, which would consume sixteen gigabytes For Case 4, the two terms B1 (d1−c) and B0 d0 in Equation XIV can each be implemented with a large table of $2^{16}$ entries. In one embodiment, the terms B1 (d1−c) and B0 d0 are each implemented with two tables of $2^8$ entries, for a total of four lookup tables. To implement the terms B1 (d1−c) and B0 d0 with four lookup tables, each of the matrices B0 and B1 is divided into two matrices of eight columns, and each of the vectors (d1−c) and d0 is divided into two 8-bit vectors.

The computer code for Case 4 needs to XOR the CRC bits with the correct bits of the input data word. Take the case of a 16-bit CRC and a 32-bit data word. Because the CRC vector is sixteen bits, the lookup tables can be sixteen bits wide instead of thirty-two bits, but there may be an efficiency advantage to keeping 32-bit values in the table with zeros in the lower sixteen bits of each entry. For example, if the table values are sixteen bits wide and the most significant bits of the data word (from a CRC polynomial point of view) are in the upper bits of the data word, then a shift will be required to align the CRC with the upper bytes of the data word before performing the XOR.

In contrast, if the entries in the tables are thirty-two bits wide, with the CRC result bits in the upper sixteen bits and zeros in the lower sixteen bits, then no shift is required because the CRC value is kept aligned to the right position in the 32-bit word. In this embodiment of Case 4, the CRC register stores a 16-bit current CRC value and 16 zero bits. An XOR operation is performed on the 32-bit data word and the 32 bits of the CRC register. Values are retrieved from the lookup tables based on the results of the XOR operation. An XOR operation is then performed on the values retrieved from the lookup tables, with the result being stored in the CRC register, thereby updating the current 16-bit CRC value.

Figure 3:
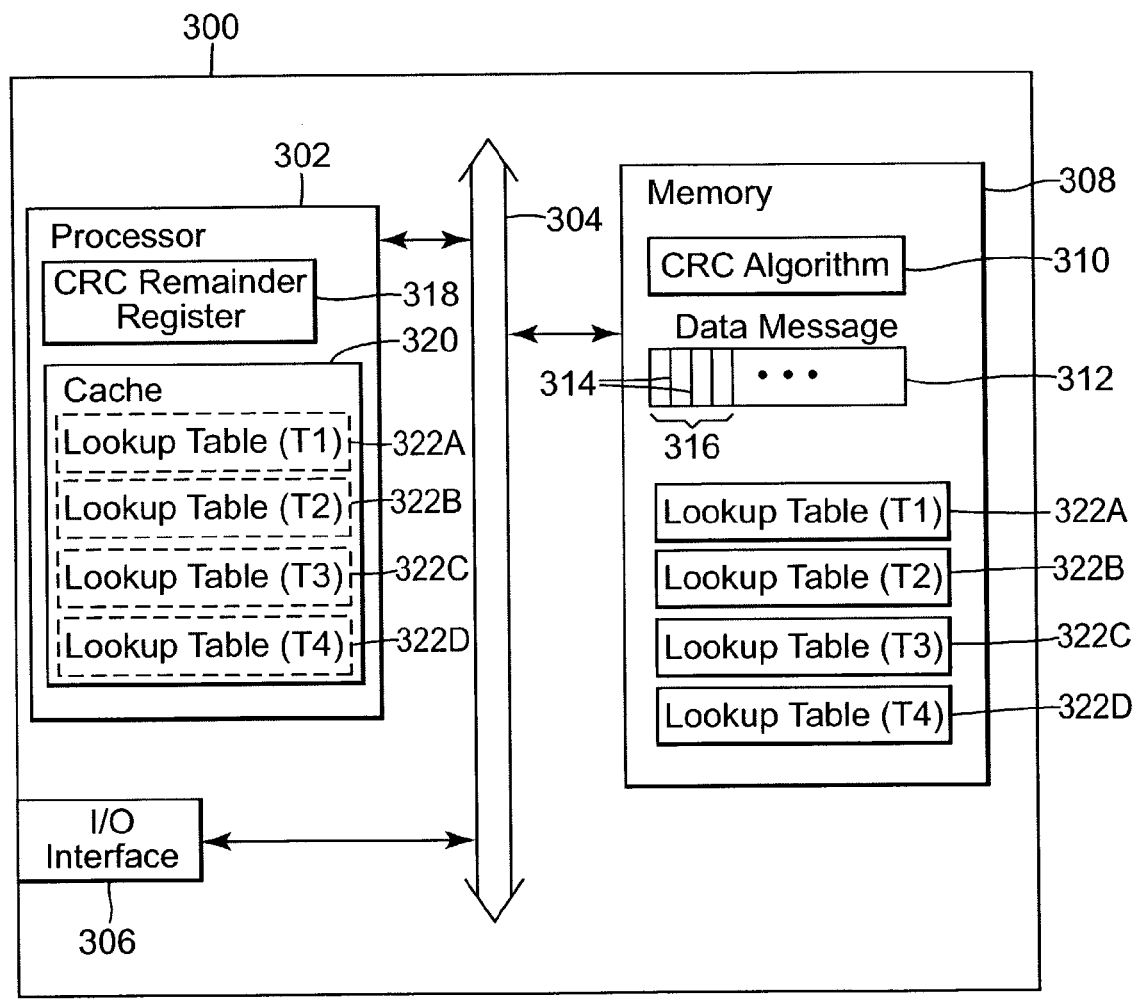
FIG. 3 is a block diagram illustrating a system for calculating CRC's according to one embodiment of the present invention.

FIG. 3 is a block diagram illustrating a system 300 for calculating CRC's according to one embodiment of the present invention. In one form of the invention, system 300 is a computer or like device. System 300 includes processor 302, input/output (I/O) interface 306, and memory 308, which are all communicatively coupled together via communication link 304. System 300 transmits and receives CRC protected data messages (e.g., data message 312) via I/O interface 306.

The memory 308 may include both volatile and nonvolatile memory components. Volatile components are those that do not retain data values upon loss of power. Nonvolatile components are those that retain data upon a loss of power. Thus, the memory 308 may comprise, for example, random access memory (RAM), read-only memory (ROM), hard disk drives, floppy disks accessed via an associated floppy disk drive, compact discs accessed via a compact disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Stored in memory 308 are CRC algorithm 310, data message 312, and lookup tables 322A-322D (collectively referred to as lookup tables 322). In one embodiment, CRC remainder register 318 is a 32-bit register. Data message 312 includes a plurality of 8-bit data bytes 314, with each set of four consecutive data bytes 314 comprising a data word 316. Processor 302 includes processor register (CRC remainder register) 318, which stores a current CRC remainder, and an internal processor cache 320. The lookup tables 322 are copied to cache 320 when used by processor 302 (as indicated by the dashed lines in FIG. 3) to provide more efficient access to the table information and increase the speed of execution.

In one embodiment, lookup tables 322A-322D are generated based on Equations XVII-XX, respectively. Each one of the lookup tables 322A-322D includes 256 entries, with each entry being four bytes wide. The four lookup tables 322A-322D, therefore, consume a total of four kilobytes of storage.

Processor 302 executes CRC algorithm 310 to process data messages (e.g., data message 312) and generate corresponding CRC's. Sometimes a data message starts or ends with a partial word of data. The bytes in such partial words are referred to as a non-word-aligned bytes or misaligned bytes. For instance, with a 32-bit word, the first or last word of memory may contain one, two, or three bytes of data rather than a full word (i.e., four bytes). One embodiment of CRC algorithm 310 handles misaligned bytes using a conventional byte-at-a-time method, and then handles the full words in the data message using a word-at-a-time method (e.g., see Case 3 and Case 4 above). Since most data messages are many words, using the less efficient byte-at-a-time method to handle a few bytes per data message has a small effect on total efficiency. System 300 is described in further detail below with reference to FIG. 4.

Figure 4:
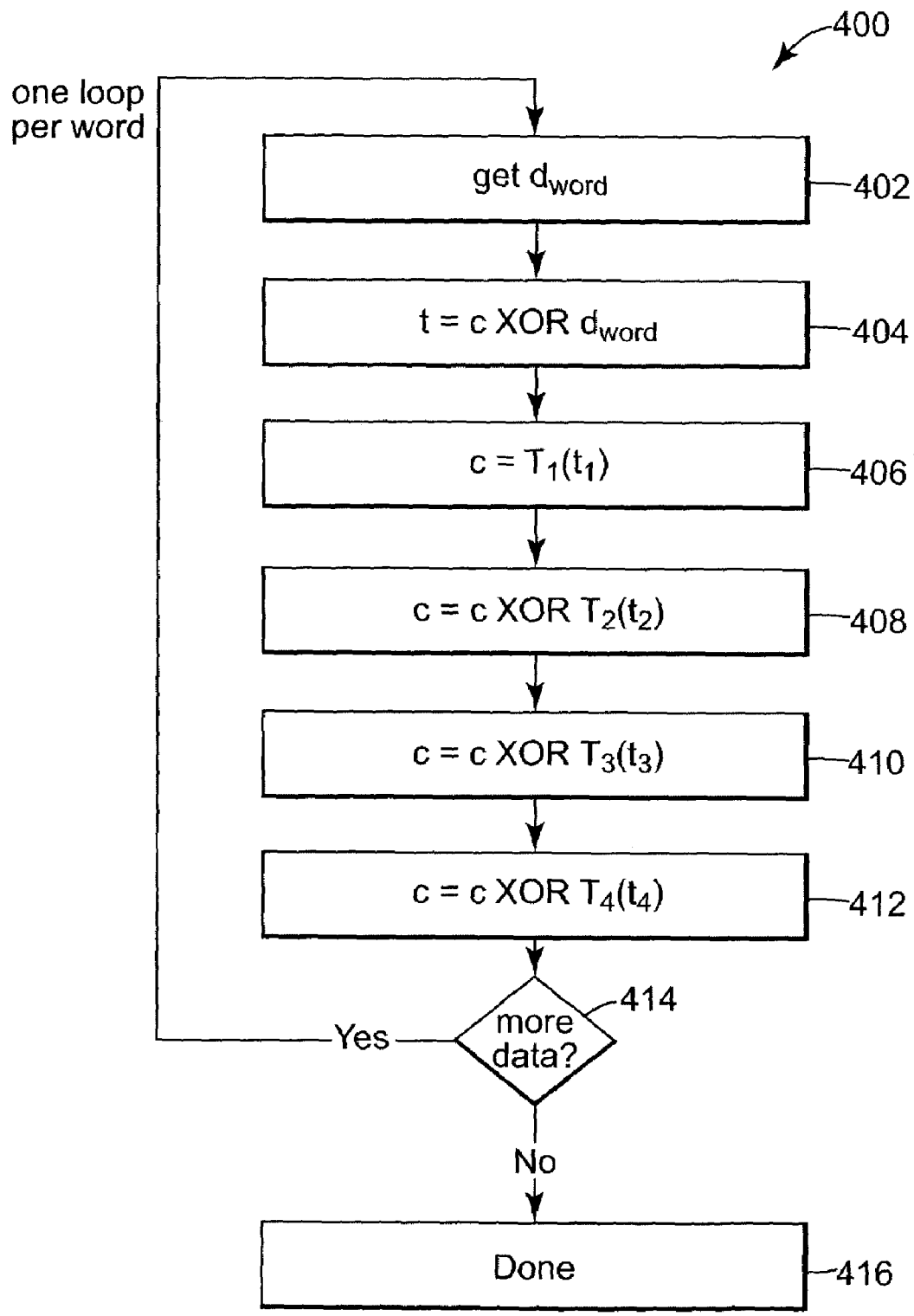
FIG. 4 is a flow diagram illustrating a method for calculating CRC's by processing a data message a word at a time according to one embodiment of the present invention.

FIG. 4 is a flow diagram illustrating a method 400 for calculating CRC's by processing a data message 312 a word at a time according to one embodiment of the present invention. In one embodiment, system 300 is configured to perform method 400 by execution of CRC algorithm 310. In step 402, processor 302 retrieves a 32-bit data word, $d_{word}$. In step 404, processor 302 performs an XOR operation on the retrieved data word, $d_{word}$, and the contents of the CRC remainder register (c) 318. Processor 302 stores the result of the XOR operation as a temporary result, t. In the illustrated embodiment, the temporary result, t, is a 4-byte value. The term $t_n$ is used to represent the $n^{th}$ byte of the temporary result, t.

In step 406, processor 302 retrieves a value from lookup table ($T_1$) 322A at a position corresponding to the first byte, $t_1$, of the temporary result, t, obtained in step 404. Thus, the first byte of the result of the XOR operation in step 404 serves as an index into the lookup table 322A. The value retrieved from the lookup table 322A is stored in the CRC remainder register 318.

In step 408, processor 302 retrieves a value from lookup table ($T_2$) 322B at a position corresponding to the second byte, $t_2$, of the temporary result, t, obtained in step 404, and performs an XOR operation on the retrieved value and the contents of the CRC remainder register 318. The result of the XOR operation is stored in the CRC remainder register 318.

In step 410, processor 302 retrieves a value from lookup table ($T_3$) 322C at a position corresponding to the third byte, $t_3$, of the temporary result, t, obtained in step 404, and performs an XOR operation on the retrieved value and the contents of the CRC remainder register 318. The result of the XOR operation is stored in the CRC remainder register 318.

In step 412, processor 302 retrieves a value from lookup table ($T_4$) 322D at a position corresponding to the fourth byte, $t_4$, of the temporary result, t, obtained in step 404, and performs an XOR operation on the retrieved value and the contents of the CRC remainder register 318. The result of the XOR operation is stored in the CRC remainder register 318.

In step 414, processor 302 determines whether there is any more data in the data message 312 to be processed. If there is more data, the method 400 returns to step 402 to process the next word 316 of data in the message 312. If there is no more data to be processed, the method 400 is done, as indicated by step 416.

Thus, to summarize one embodiment of method 400, during each iteration of the method, processor 302 XOR's a data word with the current contents of the CRC remainder register 318. Processor 302 then fetches four table values—one for each byte of the XOR result. Processor 302 XOR's the four table values with each other to produce the next CRC result.

It will be understood by a person of ordinary skill in the art that components of the present invention may reside in software on one or more computer-readable mediums. The term computer-readable medium as used herein is defined to include any kind of memory, volatile or non-volatile, such as floppy disks, hard disks, CD-ROMs, flash memory, read-only memory (ROM), and random access memory.

In one form of the invention, rather than using one very large lookup table to process more than byte at a time for CRC computations, a few small tables are used. In one embodiment, the lookup tables are small enough to be held in processor cache during computations, which is important for maintaining efficiency. One form of the present invention provides an accelerated software implementation for CRC computations. The method according to one form of the invention reduces the processor load for CRC computations. Other embodiments of the present invention are applicable to other areas where modulo-2 polynomial math is used in software, such as in some cryptography algorithms.

Test code implementing one embodiment of a word-at-a-time CRC method as described herein has been developed. The test code processed 32-bit data words and used four tables with 256 entries, with each entry having the same width as the CRC (i.e., 32 bits). The tables were small enough to be held in processor cache. And the test code computed CRC's in about half the cycles required by code based on the conventional byte-at-a-time method, because many operations used in the conventional code were not needed in the test code, such as the shift operations, and half of the XOR operations.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A system for computing a CRC value, comprising:
at least one memory for storing a data message, a current CRC value, and a plurality of lookup tables, the data message including a plurality of words, each word including more bytes than the current CRC value, each of the lookup tables storing a plurality of multi-byte CRC values; and
a processor for processing the message a word at a time, the processor configured to update the current CRC value during processing of each word based on an XOR of a first subset of the word and the current CRC value, and based on a multi-byte CRC value retrieved from each one of the lookup tables.

2. The system of claim 1, wherein each word of the data message includes four 8-bit bytes, and the current CRC value includes two 8-bit bytes.

3. The system of claim 1, wherein the processor is configured to retrieve a first subset of the multi-byte CRC values from a first subset of the lookup tables based on a result of the XOR, and wherein the processor is configured to retrieve a second subset of the multi-byte CRC values from a second subset of the lookup tables based on a second subset of the word.

4. The system of claim 3, wherein the processor is configured to perform an XOR of the multi-byte CRC values retrieved from the lookup tables, thereby generating an updated current CRC value.

* * * * *